United States Patent
Yamaguchi

(12)
(10) Patent No.: US 6,316,929 B1
(45) Date of Patent: Nov. 13, 2001

(54) FREQUENCY MEASUREMENT TEST CIRCUIT AND SEMICONDUCTOR INTEGRATED CIRCUIT HAVING THE SAME

(75) Inventor: Michimasa Yamaguchi, Kanagawa (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/492,233

(22) Filed: Jan. 27, 2000

(30) Foreign Application Priority Data

Jan. 29, 1999 (JP) .................................................. 11-022019

(51) Int. Cl.[7] ......................... G01R 23/12; G01R 27/00; H03B 19/00
(52) U.S. Cl. ........................ 324/76.53; 324/600; 327/114
(58) Field of Search ................... 324/600, 76.53; 327/21, 114, 159, 115, 160, 295; 331/14, 1 A

(56) References Cited

U.S. PATENT DOCUMENTS

| | | | | |
|---|---|---|---|---|
| 3,646,441 | * | 2/1972 | Magnuski ............................ 375/211 |
| 3,684,965 | * | 8/1972 | Gautney et al. ..................... 455/35.1 |
| 3,958,183 | * | 5/1976 | Schaefer ................................ 327/21 |
| 4,115,743 | * | 9/1978 | Lalande et al. ........................ 331/14 |
| 4,239,478 | * | 12/1980 | Tanaka et al. .......................... 431/24 |
| 4,414,504 | * | 11/1983 | Kennedy ............................ 324/76.53 |
| 4,423,383 | * | 12/1983 | Svendsen ............................... 327/114 |
| 4,427,302 | * | 1/1984 | Watanabe .............................. 368/200 |
| 4,465,982 | * | 8/1984 | Jernakoff ................................ 331/1 A |
| 4,580,278 | * | 4/1986 | Yamamoto ............................. 375/354 |
| 4,661,965 | * | 4/1987 | Maru ....................................... 375/361 |
| 4,743,864 | * | 5/1988 | Nakagawa et al. ................... 331/1 A |
| 4,916,403 | * | 4/1990 | Sudoh et al. ........................... 327/159 |
| 5,111,152 | * | 5/1992 | Makino ................................. 329/300 |
| 5,164,684 | * | 11/1992 | Tanaka et al. ......................... 331/1 A |
| 5,189,379 | * | 2/1993 | Saito et al. ............................. 331/1 A |
| 5,710,774 | * | 1/1998 | Suh et al. ............................... 370/513 |
| 5,748,120 | * | 5/1998 | Yasuda ..................................... 341/61 |

FOREIGN PATENT DOCUMENTS

| | | |
|---|---|---|
| 61-3071 | 1/1986 | (JP) . |
| 61-264266 | 11/1986 | (JP) . |
| 1-121768 | 5/1989 | (JP) . |
| 3-283821 | 12/1991 | (JP) . |
| 3-291020 | 12/1991 | (JP) . |
| 07-101224 | 11/1995 | (JP) . |
| 8-316832 | 11/1996 | (JP) . |
| 9-197024 | 7/1997 | (JP) . |

* cited by examiner

*Primary Examiner*—Glenn W. Brown
*Assistant Examiner*—Wasseem H. Hamdan
(74) *Attorney, Agent, or Firm*—Sughrue, Mion, Zinn, Macpeak & Seas, PLLC

(57) ABSTRACT

A frequency measurement test circuit includes a frequency divider, and a detection circuit. The frequency divider frequency-divides an input to be measured. The detection circuit outputs a signal of level set on the basis of a relationship in magnitude between the frequency of the signal frequency-divided by the frequency divider and that of a reference clock signal.

14 Claims, 4 Drawing Sheets

US 6,316,929 B1

FREQUENCY MEASUREMENT TEST CIRCUIT AND SEMICONDUCTOR INTEGRATED CIRCUIT HAVING THE SAME

BACKGROUND OF THE INVENTION

The present invention relates to a frequency measurement test circuit used to measure the frequency of a signal output from, e.g., a phase-locked loop incorporated in a large scale integrated circuit, and a semiconductor integrated circuit having the frequency measurement test circuit.

Conventionally, to test a large scale integrated circuit (to be referred to as an LSI hereinafter) incorporating a phase-locked loop (to be referred to as a PLL hereinafter), generally, the frequency in the locked state of the PLL is measured using an analog tester and digital tester, and it is checked whether the frequency has a desired value. That is, testing need be performed twice with the analog tester and digital tester. However, the analog tester and digital tester are expensive, and the measurement time is long because measurement must be performed twice. An apparatus capable of testing frequencies using only a digital tester has been disclosed.

FIGS. 3A and 3B show conventional test circuit. As shown in FIGS. 3A and 3B, conventional digital testers (test circuits) 11a and 11b are arranged outside digital integrated circuits (to be referred to as ICs hereinafter) 12 each incorporating a PLL. The digital testers 11a and 11b have external and internal frequency measurement devices 13a and 13b, respectively. The frequency measurement device 13a or 13b measures the frequency in the locked state of the PLL. The digital tester 11a or 11b determines whether the measured frequency has a desired value. Since such conventional digital tester 11a or 11b requires the frequency measurement device 13a or 13b, the circuit becomes complex. Japanese Patent Laid-Open No. 9-197024 has proposed a simple and inexpensive test circuit that solves the problem.

FIG. 4 shows the conventional test circuit disclosed in Japanese Patent Laid-Open No. 9-197024. The conventional test circuit disclosed in this prior art has two counters 22a and 22b which receive a signal output from a PLL 21. The two counters 22a and 22b are selected by a control signal CE whose duty ratio is 50%. The test circuit also has a comparator 23 for comparing the signal output from the counter 22a within a predetermined period with that output from the counter 22b within a predetermined period. The test circuit further has a decoder 24 for outputting a signal in association with the output signals from the counters 22a and 22b and comparator 23.

This conventional test circuit requires no frequency measurement device, and the circuit is simple. Since testing can be performed using only one tester, the circuit is less expensive than conventional circuits. However, the conventional test circuit disclosed in the above prior art requires the two counters 22a and 22b to detect that the phase is locked in the PLL 21. Hence, the measurement accuracy must be increased by prolonging the measurement time. However, to prolong the measurement time, the counters 22a and 22b must have a large circuit scale. In addition, since the duty ratio of the control signal CE for controlling the counters 22a and 22b must be 50%, very high accuracy is required. To solve these problems, a circuit for detecting the phase-locked state is generally provided in the PLL.

Recently, a demand has arisen for measurement of not only the frequency of the PLL but also the oscillation frequency of a voltage-controlled oscillator (to be referred to as a VCO hereinafter) incorporated in the IC. The above-described circuit that receives the lock detection signal from the PLL can measure only the frequency in the phase-locked state of the PLL.

SUMMARY OF THE INVENTION

The present invention has been made in consideration of the above problems, and has as its object to provide a frequency measurement test circuit capable of accurately measuring a frequency whose phase is not locked, and a semiconductor integrated circuit having the frequency measurement test circuit.

In order to achieve the above object, according to the present invention, there is provided a frequency measurement test circuit comprising a frequency divider for frequency-dividing an input to be measured, and a detection circuit for outputting a signal of level set on the basis of a relationship in magnitude between the frequency of the signal frequency-divided by the frequency divider and that of a reference clock signal.

DESCRIPTION OF THE PREFERRED EMBODIMENT

A test circuit according to an embodiment of the present invention will be described below in detail with reference to the accompanying drawings.

Figure 1:
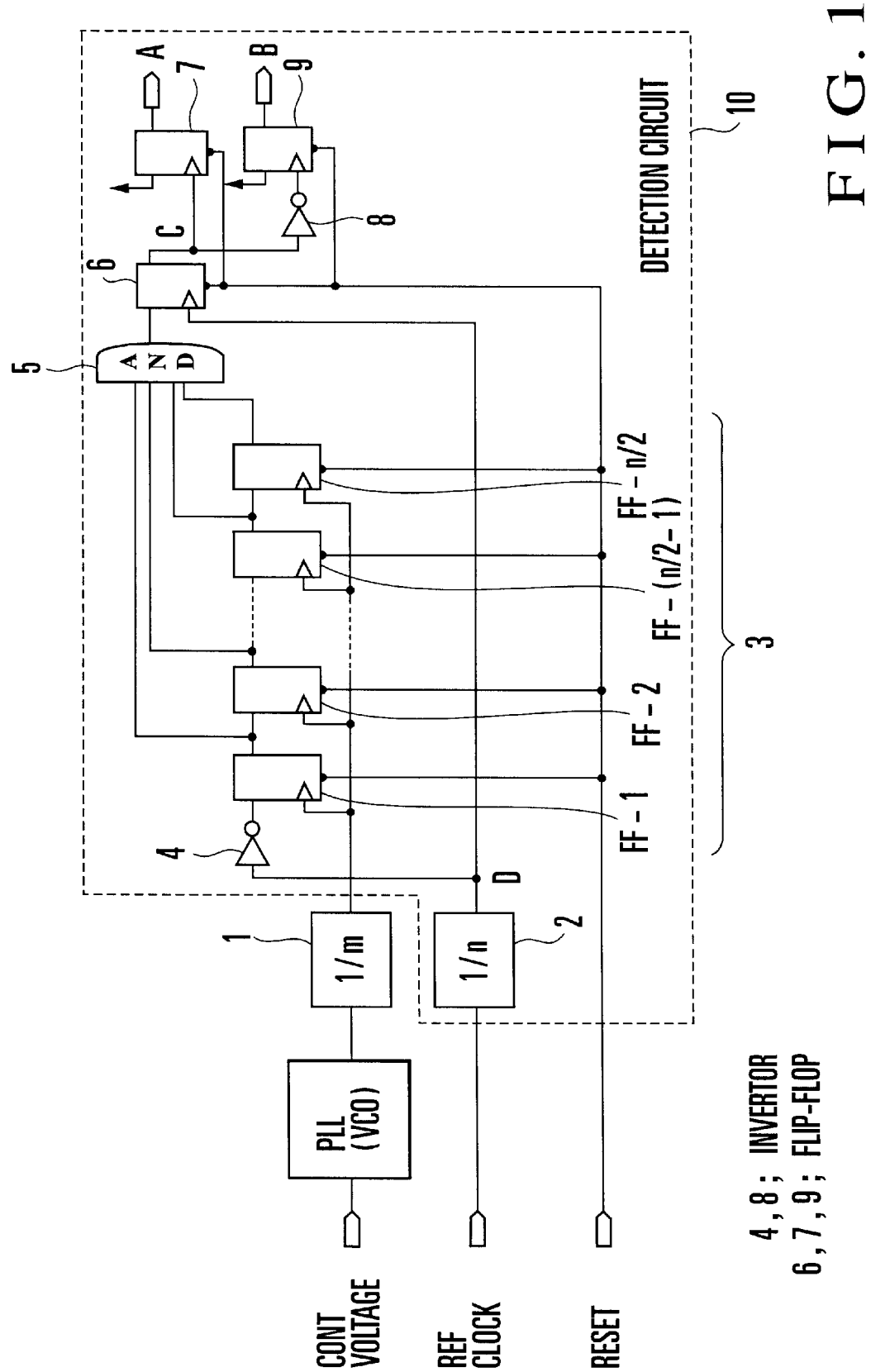
FIG. 1 is a block diagram showing the arrangement of a frequency measurement test circuit according to an embodiment of the present invention.

FIG. 1 shows the arrangement of a frequency measurement test circuit according to an embodiment of the present invention. The circuit of this embodiment has a frequency divider 1 for receiving the output signal from a phase-locked loop (PLL) or a voltage-controlled oscillator (VCO) that receives a constant voltage. The frequency divider 1 divides the frequency of the input signal to 1/m. That is, the frequency of the signal from the PLL or VCO is multiplied by 1/m by the frequency divider 1. The circuit also has a frequency divider 2 that receives a reference clock signal. The frequency divider 2 divides the frequency of the input signal to 1/n. That is, the frequency of the reference clock signal is multiplied by 1/n by the frequency divider 2, where n must always be an even value.

The circuit further has a shift register 3 constructed by n/2 flip-flops FF-1 to FF-n/2. The output terminal of the frequency divider 1 is connected to the clock signal input terminals of the flip-flops FF-1 to FF-n/2. In the shift register 3, every time the output signal from the frequency divider 1 changes from "0" to "1", data in the shift register 3 shifts to the output side by one stage. An inverter 4 is connected to the output terminal of the frequency divider 2. The output terminal of the inverter 4 is connected to the data input terminal of the flip-flop FF-1 located at the first stage of the shift register 3 having n/2 stages. The test circuit also has an AND circuit 5 for ANDing signals from all the output terminals of the 2/n flip-flops FF-1 to FF-n/2 of the shift register 3.

The test circuit further has a flip-flop 6 having a data input terminal connected to the output terminal of the AND circuit 5. The output terminal of the frequency divider 2 is also connected to the clock input terminal of the flip-flop 6. The test circuit also has a flip-flop 7 having a clock input terminal connected to the output terminal of the flip-flop 6 and an inverter 8 having an input terminal connected to the output terminal of the flip-flop 6. The output terminal of the inverter 8 is connected to the clock input terminal of a flip-flop 9. The data input terminals of the flip-flops 7 and 9 are fixed at "1" level. When the output signal from the flip-flop 6 changes from "0" to "1", the output signal from the flip-flop 7 changes from "1" to "0". When the output signal from the flip-flop 6 changes from "1" to "0", the output signal from the flip-flop 9 changes from "0" to "1". For this reason, it can be detected that the output signal from the flip-flop 6 has changed from "0" to "1" or from "1" to "0". A reset supply terminal to which a reset signal is supplied is connected to the reset input terminals of all the flip-flops. The frequency divider 2, shift register 3, inverters 4 and 8, AND circuit 5, and flip-flops 6, 7, and 9 constitute a detection circuit 10 for outputting a signal of level set on the basis of the relationship in magnitude between the frequency of the signal frequency-divided by the frequency divider 1 and that of the reference clock signal.

The operation of this embodiment having the above-described arrangement will be described next. Before inspecting the frequency, "0" is input to the reset signal when a signal from the PLL or VCO and the reference clock signal are being supplied, thereby resetting all the flip-flops. With this operation, all bits of the shift register 3 and all the output signals from the AND circuit 5 and flip-flops 6, 7, and 9 become "0".

Inspection is started by changing the reset signal from "0" to "1". When the output signal from the frequency divider 2 is "0", the input value to the first flip-flop FF-1 of the shift register 3 is "1". In this state, when the output signal from the frequency divider 1 changes from "0" to "1", the input value "1" to the first flip-flop FF-1 of the shift register 3 is input to the second flip-flop FF-2. When the output signal from the frequency divider 1 changes from "0" to "1" again, the input value "1" to the first and second flip-flops FF-1 and FF-2 of the shift register 3 is input to the third flip-flop. In this way, every time the output from the frequency divider 1 changes from "0" to "1" while the output from the frequency divider 2 is being "0", the input value "1" is shifted to the next stage in the shift register 3.

In this embodiment, all the output terminals of the bits of the shift register 3 are connected to the AND circuit 5. When all the output values from the flip-flops in the shift register 3 become "1" as the result of the above-described shift, the output from the AND circuit 5 is "1". Otherwise, the output from the AND circuit 5 remains "0". After this, when the output signal from the frequency divider 2 changes from "0" to "1", the flip-flop 6 receives the output signal from the AND circuit 5 and outputs the signal to the flip-flops 7 and 9. At this time, when the output signal from the flip-flop 6 changes from "0" to "1", the output signal from the flip-flop 7 changes to "1". When the output signal from the flip-flop 6 changes from "1" to "0", the output signal from the flip-flop 9 changes to "1". Let X (Hz) be the frequency of the signal output from the PLL or VCO, and Y (Hz) be the frequency of the reference clock signal. The outputs from the flip-flops 7 and 9 change depending on the relationship in magnitude between (X÷m) and Y.

Figure 2A:
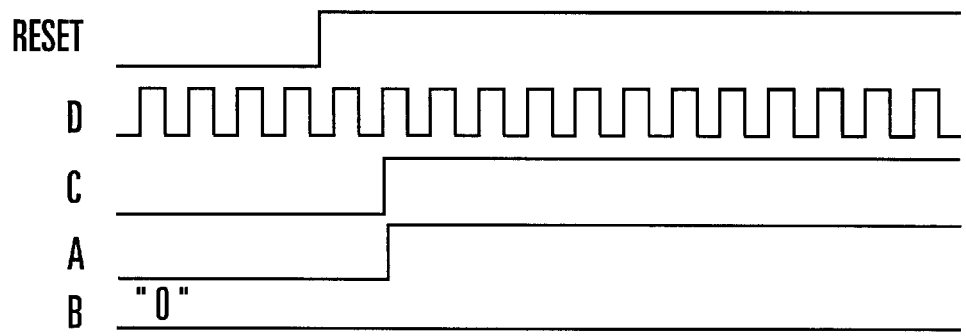
FIGS. 2A, 2B, and 2C are timing charts showing operation of the frequency measurement test circuit according to the embodiment of the present invention.
Figure 2B:
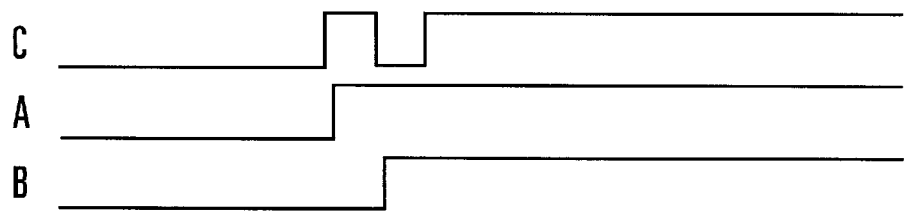
Figure 2C:
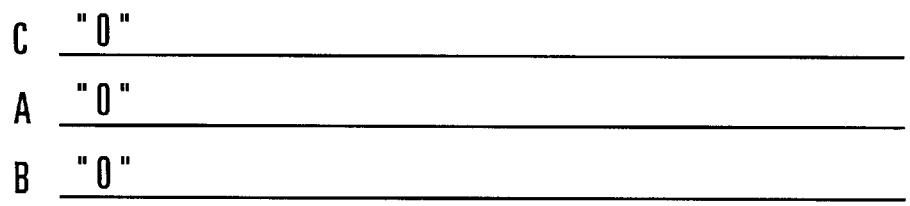
Figure 3:
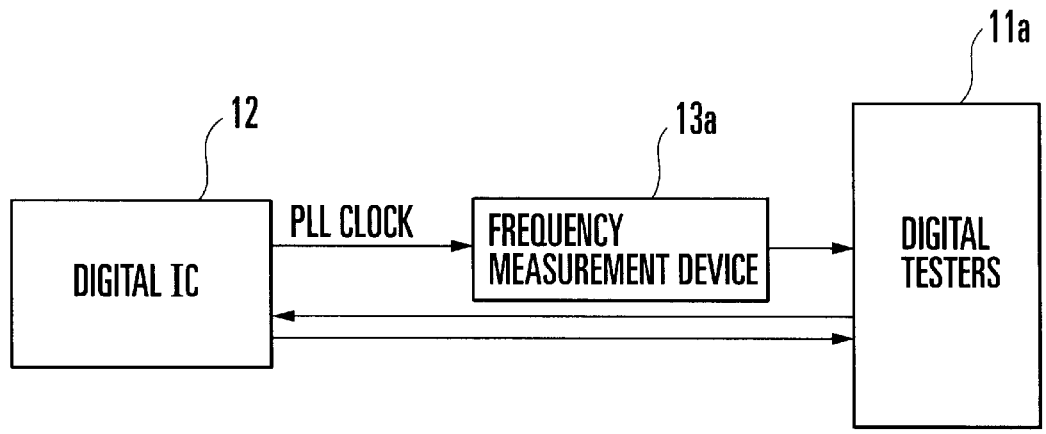
FIGS. 3A and 3B are block diagrams showing conventional test circuits.
Figure 3:
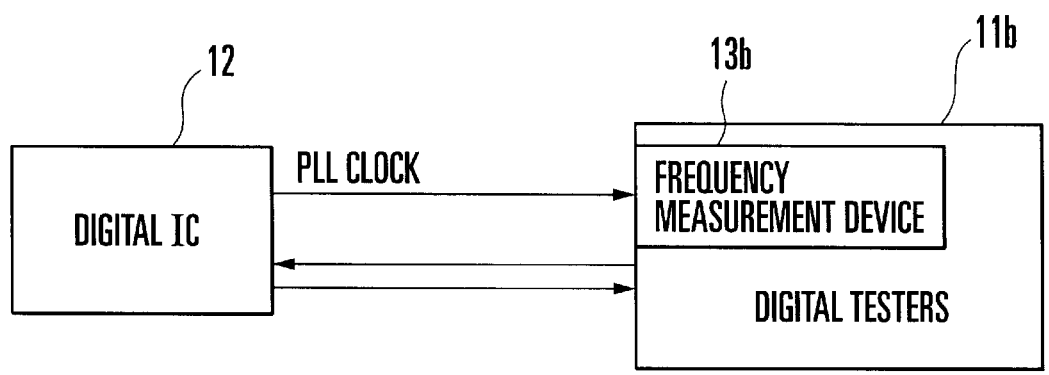
Figure 4:
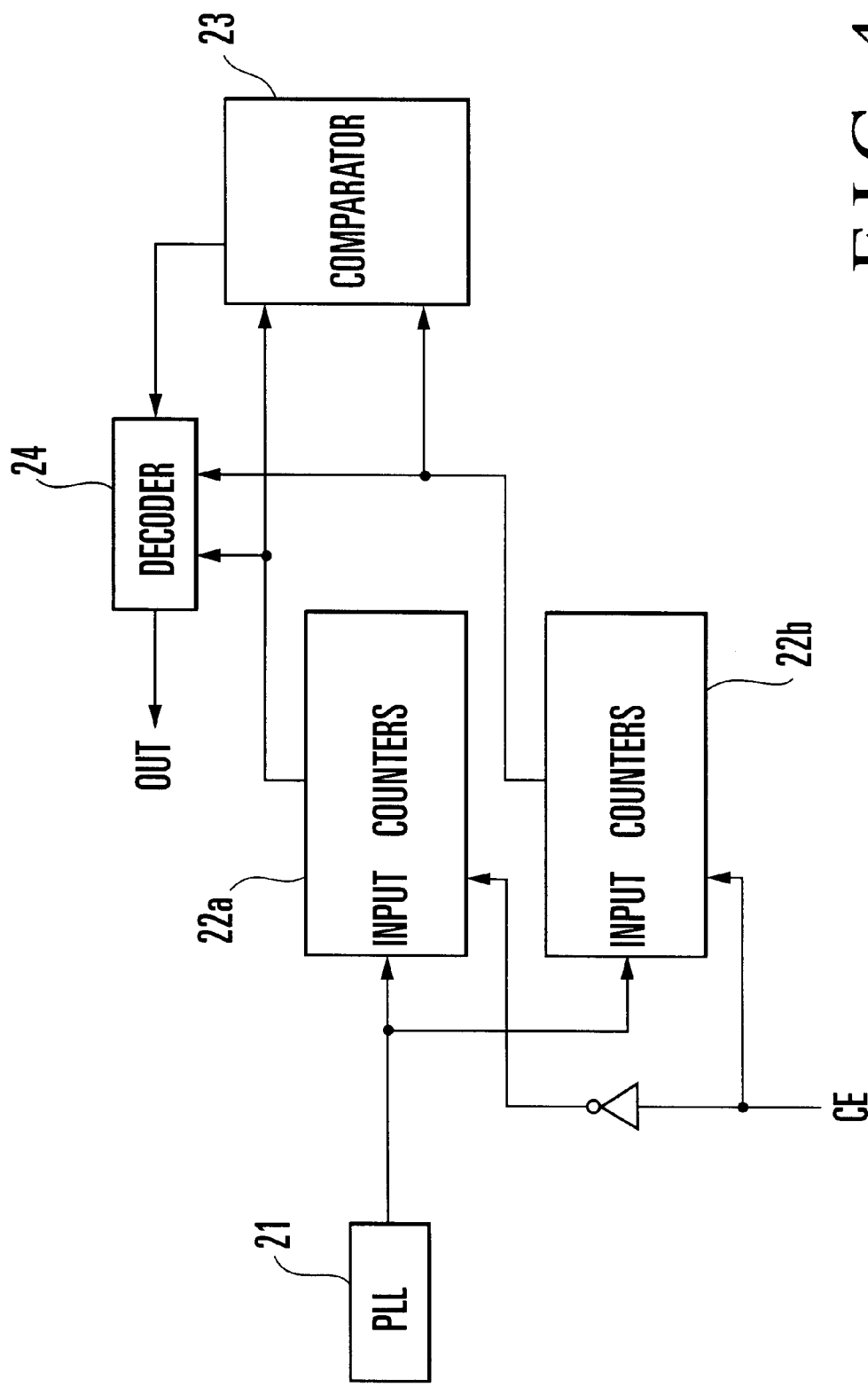
FIG. 4 is a block diagram showing a conventional test circuit disclosed in Japanese Patent Laid-Open No. 9-197024.

FIGS. 2A, 2B, and 2C show the operation of the frequency measurement test circuit according to the embodiment of the present invention. FIG. 2A shows a case wherein (X÷m)≧Y holds. FIG. 2B shows a case wherein (X÷m)<Y holds, and the difference is small. FIG. 2C shows a case wherein (X÷m)<Y holds, and the difference is large.

When (X÷m)≧Y holds (case 1), the output signal from the frequency divider 1 changes from "0" to "1" n/2 times or more while the output signal from the frequency divider 2 is being "0". For this reason, all bits of the shift register 3 having n/2 stages are fixed at "1". As shown in FIG. 2A, the output signal from the AND circuit 5 is "1". When the output signal from the frequency divider 2 changes from "0" to "1", the output signal from the flip-flop 6 changes from "0" to "1". Consequently, the output from the flip-flop 7 is fixed at "1", and the output signal from the flip-flop 9 is fixed at "0".

Two situations are assumed when (X÷m)<Y holds. As one situation, the difference between (X÷m) and Y is small, and the output signal from the frequency divider 1 changes from "0" to "1" n/2 times or a number of times less than n/2 while the output signal from the frequency divider 2 is being "0". As the other situation, the difference between (X÷m) and Y is large, and the output signal from the frequency divider 1 always changes from "0" to "1" a number of times less than n/2 while the output signal from the frequency divider 2 is being "0".

Assume that the difference between (X÷m) and Y is small, and the output signal from the frequency divider 1 changes from "0" to "1" n/2 times or a number of times less than n/2 while the output signal from the frequency divider 2 is being "0"(case 2). In this case, as shown in FIG. 2B, when the output signal from the frequency divider 1 changes from "0" to "1" n/2 times, the same operation as that when (X÷m)≧Y holds is performed. For this reason, when the output signal from the frequency divider 2 changes from "0" to "1", the output signal from the flip-flop 6 is "1".

When the output signal from the frequency divider 1 changes from "0" to "1" a number of times less than n/2, the output signal from the frequency divider 2 changes from "0" to "1" before all bits of the shift register 3 change to "1". For this reason, when the output signal from the frequency divider 2 changes from "0" to "1", the output signal from the flip-flop 6 is "0".

FIG. 2B shows an operation when the output from the frequency divider 1 changes n/2 times in the first and third changes in the output signal from the frequency divider 2 from "0" to "1", and the output from the frequency divider 2 changes a number of times less than n/2 in the second change. In the operation shown in FIG. 2B, when the output signal from the frequency divider 2 changes from "0" to "1" for the first time, the output signal from the flip-flop 7 is "1", and the output signal from the flip-flop 9 is "0". After this, when the output signal from the frequency divider 2 changes from "0" to "1" for the second time, the output signal from the flip-flop 6 changes from "1" to "0. For this reason, the output signal from the flip-flop 9 changes from "0" to "1". However, the output signal from the flip-flop 7 remains "1".

When the output signal from the frequency divider 2 changes from "0" to "1" for the third time, the output signal from the flip-flop 6 changes from "0" to "1". However, the output signals from the flip-flops 7 and 9 are already "1" and remain "1". Finally, the output signal from the flip-flop 7 is fixed at "1", and the output signal from the flip-flop 9 is also fixed at "1".

Assume that the difference between (X÷m) and Y is large, and the output signal from the frequency divider 1 always changes from "0" to "1" a number of times less than n/2 while the output signal from the frequency divider 2 is being "0" (case 3). In this case, several bits of the shift register 3 are always "0". For this reason, the output signal from the frequency divider 2 changes from "0" to "1" before all bits of the shift register 3 change to "1", as shown in FIG. 2C. As a consequence, even when the output signal from the frequency divider 2 changes from "0"to "1", the output signal from the flip-flop 6 remains "0". Hence, the output signals from the flip-flops 7 and 9 also remain "0". For this reason, the output signals from the flip-flops 7 and 9 are fixed at "0".

According to the this embodiment, the finally fixed values of the output signals from the flip-flops 7 and 9 change depending on the relationship in magnitude between (X÷m) and Y. More specifically, in case 1, the output signal from the flip-flop 7 is fixed at "1", and the output signal from the flip-flop 9 is fixed at "0". In case 2, both the output signals from the flip-flops 7 and 9 are fixed at "1". In case 3, both the output signals from the flip-flops 7 and 9 are fixed at "0".

When the output signal from the flip-flop 7 is fixed at "1", and the output signal from the flip-flop 9 is fixed at "0", the frequency of the output signal from the PLL or VCO has a value equal to or larger than that obtained by multiplying the frequency of the reference clock signal by m. When both the output signals from the flip-flops 7 and 9 are fixed at "1", the frequency of the output signal from the PLL or VCO has a value smaller than that obtained by multiplying the frequency of the reference clock signal by m, and the difference between the frequencies is small. When both the output signals from the flip-flops 7 and 9 are fixed at "0", the frequency of the output signal from the PLL or VCO has a value smaller than that obtained by multiplying the frequency of the reference clock signal by m, and the difference between the frequencies is large.

A method of measuring a frequency with a tester using an LSI incorporating the test circuit of this embodiment will be described next. Normally, a tester uses a test pattern, and an input waveform and output expectation value are described in the test pattern. In this embodiment, the reference clock used in the test circuit is input from the tester to the LSI, and the test result by the test circuit is received from the LSI to the tester and compared with the expectation value prepared in the test pattern, thereby obtaining the relationship between the reference clock and the oscillation frequency of the PLL or VCO.

In the case to be described below, a value output from the LSI when the value obtained by dividing the oscillation frequency of the PLL or VCO by m is equal to or larger than the reference clock is described as the expectation value. That is, the state wherein the output signal from the flip-flop 7 is finally fixed at "1", and the output signal from the flip-flop 9 is "0" is described as the expectation value.

First, the frequency of the reference clock signal is set at $Z_1$ (Hz), and testing is performed. If the output value does not coincide with the expectation value, the value obtained by multiplying the oscillation frequency of the PLL or VCO by m is smaller than the value of the operating frequency of the reference clock signal. When the output value coincides with the expectation value, the value obtained by multiplying the oscillation frequency of the PLL or VCO by m is equal to or larger than the value of the operating frequency of the reference clock signal.

Next, the frequency of the reference clock signal is set at $Z_2$ (Hz), and the same testing as described above is performed. When the output value for the frequency set at $Z_1$ (Hz) coincides with the expectation value, testing is performed assuming that $Z_2 > Z_1$. When the output value for the frequency set at $Z_1$ (Hz) does not coincide with the expectation value, testing is performed assuming that $Z_2 < Z_1$. Under this condition, the relationship between the reference clock signal and the oscillation frequency of the PLL or VCO is obtained.

When the operating frequency of the reference clock signal is repeatedly changed in the above-described manner, the maximum frequency of the reference clock signal for which the output value coincides with the expectation value can be obtained. Letting $Z_x$(Hz) be the frequency of the reference clock, the oscillation frequency of the PLL or VCO is given by $(Z_x \times m)$ (Hz), and the oscillation frequency of the PLL or VCO can be reliably obtained. When it is to be checked using the tester whether the oscillation frequency of the PLL or VCO is higher (or lower) than a given frequency, the range matching with the expectation value need not be obtained, and only testing is performed once.

According to this embodiment, since measurement can be performed independently of the phase-locked state of the PLL, the test circuit can be used to test a single VCO. In addition, since no counter is required, the circuit scale is small. Furthermore, the frequency can be measured at a high accuracy. Since the frequency division value of the frequency divider can be changed, the test circuit can be easily adapted to various types of digital testers.

As has been described above, according to the present invention, a detection circuit for outputting different signals in association with the difference between the frequency of the signal frequency-divided by the frequency divider and that of the reference clock signal is prepared. Since the relationship in magnitude between the frequency and the reference clock signal can be obtained independently of the phase-locked state of the input signal to be measured, the test circuit can be used to test a voltage-controlled oscillator. Since no counter is required, the circuit scale can be made small, and the frequency can be accurately measured. Additionally, since the frequency division value of the frequency divider can be changed, the test circuit can be easily adapted to various types of digital testers. In the present invention, since the test circuit is incorporated, the oscillation frequency of a phase-locked loop or voltage-controlled oscillator can be measured.

What is claimed is:

1. A frequency measurement test circuit comprising:

a frequency divider for frequency-dividing a input signal to be measured; and a detection circuit for outputting a signal of level set on the basis of a relationship in magnitude between the frequency of the input signal frequency-divided by said frequency divider and that of a reference clock signal, said detection circuit comprises a second frequency divider for dividing the frequency of the reference clock signal to 1/n (n is a positive even number), an inverter for inverting a signal output from said second frequency divider, a shift register constructed by (n/2) series-connected flip-flops including a flip-flop at a first stage having a data input terminal connected to an output terminal of said inverter, and an AND circuit for ANDing output signals from said flip-flops.

2. A circuit according to claim 1, wherein said detection circuit comprises a second flip-flop having a data input terminal to which an output signal from said AND circuit is input, and a clock input terminal to which a signal divided to 1/n by said second frequency divider is input.

3. A circuit according to claim 2, wherein
said detection circuit comprises a third flip-flop circuit having a clock input terminal to which an output signal from said second flip-flop is input, and a data input terminal fixed at high level, a second inverter for inverting the output signal from said second flip-flop, and a fourth flip-flop circuit having a clock input terminal to which a signal output from said second inverter is input, and a data input terminal fixed at high level.

4. A semiconductor integrated circuit comprising:
a frequency measurement test circuit, said frequency measurement circuit comprising:
  a frequency divider for frequency-dividing a input signal to be measured; and
  a detection circuit for outputting a signal of level set on the basis of a relationship in magnitude between the frequency of the input signal frequency-divided by said frequency divider and that of a reference clock signal, said detection circuit comprises a second frequency divider for dividing the frequency of the reference clock signal to 1/n (n is a positive even number), an inverter for inverting a signal output from said second frequency divider, a shift register constructed by series-connected flip-flops including a flip-flop at a first stage having a data input terminal connected to an output terminal of said inverter, and an AND circuit for ANDing output signals from said flip-flops; and
a circuit for outputting the input signal to be measured.

5. A circuit according to claim 4, wherein
said detection circuit comprises a second flip-flop having a data input terminal to which an output signal from said AND circuit is input, and a clock input terminal to which a signal divided to 1/n by said second frequency divider is input.

6. A circuit according to claim 5, wherein
said detection circuit comprises a third flip-flop circuit having a clock input terminal to which an output signal from said second flip-flop is input, and a data input terminal fixed at high level, a second inverter for inverting the output signal from said second flip-flop, and a fourth flip-flop circuit having a clock input terminal to which a signal output from said second inverter is input, and a data input terminal fixed at high level.

7. A circuit according to claim 4, wherein
said circuit for outputting the signal to be measured comprises a phase-locked loop.

8. A circuit according to claim 4, wherein
said circuit for outputting the input signal to be measured comprises a voltage-controlled oscillator.

9. A frequency measurement test circuit comprising:
a frequency divider for dividing the frequency of an input signal to be measured to 1/m, where m is a positive whole number; and
a detection circuit for outputting a binary signal based upon the difference between the frequency of the input signal frequency-divided by said frequency divider and the frequency of a reference clock signal, said detection circuit comprising:
  a reference frequency divider for dividing the frequency of the reference clock signal to 1/n, where n is a positive even number;
  an inverter for inverting a signal output from said reference frequency divider;
  a shift register constructed by (n/2) series-connected flip-flops including a flip-flop at a first stage having a data input terminal connected to an output terminal of said inverter and said flip-flops having their respective clock terminals connected to an output terminal of said reference frequency divider; and
  an AND circuit for ANDing output signals from said flip-flops.

10. The frequency measurement test circuit according to claim 9, said detection circuit further comprises:
  a second flip-flop having a data input terminal to which an output signal from said AND circuit is input; and
  a clock input terminal to which a signal divided to 1/n by said reference frequency divider is input.

11. The frequency measurement test circuit according to claim 10, said detection circuit further comprises:
  a third flip-flop circuit having a clock input terminal to which an output signal from said second flip-flop is input;
  a data input terminal fixed at high level, a second inverter for inverting the output signal from said second flip-flop;
  a fourth flip-flop circuit having a clock input terminal to which a signal output from said second inverter is input; and
  a data input terminal fixed at high level.

12. A semiconductor integrated circuit comprising:
  a frequency measurement test circuit as claimed in claim 9; and
  a circuit for outputting the input signal to be measured.

13. The semiconductor integrated circuit according to claim 12, said circuit for outputting the input signal to be measured comprises a phase-locked loop.

14. The semiconductor integrated circuit according to claim 12, said circuit for outputting the input signal to be measured comprises a voltage-controlled oscillator.

* * * * *